United States Patent [19]

Doyle

[11] 4,316,263

[45] Feb. 16, 1982

[54] TRANSFER AND REPLICATION ARRANGEMENT FOR MAGNETIC BUBBLE MEMORY DEVICES

[75] Inventor: William D. Doyle, Dresher, Pa.

[73] Assignee: Sperry Corporation, New York, N.Y.

[21] Appl. No.: 73,772

[22] Filed: Sep. 10, 1979

[51] Int. Cl.³ .............................................. G11C 19/08
[52] U.S. Cl. ........................................ 365/12; 365/15; 365/23
[58] Field of Search ............................. 365/12, 15, 23

[56] References Cited

PUBLICATIONS

Proceedings of the IEEE–vol. 63, No. 8; Aug. 1975, pp. 1176–1195.
IEEE Transactions on Magnetics–vol. Mag. 12, No. 6; Nov. 1976, pp. 614–617.
"Passive Replicator for Magnetic Bubbles" by T. J. Nelson of Bell Laboratories, Murray Hill, N.J. 07974.
IBM Technical Disclosure Bulletin–vol. 19, No. 7; Dec. 1976, pp. 2744–2745.

*Primary Examiner*—James W. Moffitt
*Attorney, Agent, or Firm*—Robert E. Lee, Jr.; Kenneth T. Grace; Marshall M. Truex

[57] ABSTRACT

A magnetic bubble replication and transfer arrangement is disclosed which provides for replicating magnetic bubbles in thin planar layers of magnetic material without the need for electrical current carrying conductor elements. The arrangement includes a replicating half-disc permalloy element disposed in a particular way between first and second tracks formed from half-disc elements which are deposited on a surface of the magnetic layer. When a rotating magnetic field in the plane of the material is rotated in a predetermined direction with respect to the above arrangement, replication of a bubble in the first track occurs at a replication region where a portion of the replicating element is adjacent the first track. The original bubble continues movement within the first track while the newly formed bubble moves along the replicating element into the second track in response to rotation of the in-plane magnetic field.

Transfer of bubbles from the second track to the first track and transfer without replication from the first track to the second track is provided for by applying timed electrical signals to a transfer electrical conductor which is interlinkably disposed between the magnetic layer and elements of the second track and a portion of the replicating element adjacent the first track. The timed electrical signals are applied for specific portions of the rotation cycle of the in-plane field to effect bubble transfer between first and second tracks.

13 Claims, 3 Drawing Figures

TRANSFER AND REPLICATION ARRANGEMENT FOR MAGNETIC BUBBLE MEMORY DEVICES

BACKGROUND OF THE INVENTION

This invention relates to magnetic bubble memories and devices for passive replication and movement of bubbles therein.

Magnetic bubbles represent a new memory technology for computers which promises high bit storage densities in excess of $10^6$ bits per inch$^2$ and fast memory access times.

When specially fabricated thin planar magnetic materials are magnetized by a bias magnetic field normal to the plane of the material, magnetic bubbles can be formed that comprise single wall cylindrical domains of reverse magnetization, commonly known as bubbles. Bubbles are moved within the material in response to magnetic fields applied thereto including in-plane rotating magnetic fields. This movement or propagation of bubbles is controlled in a precise manner through the use of permalloy elements deposited on the surface of the thin layer by modern lithographic techniques in predetermined patterns which provide paths along which the bubbles move. The shape of the permalloy elements are important in obtaining correct movement of bubbles and facilitating the pattern design. Past candidate shapes are T-bar, chevron, and most recently half-discs. For discussion of magnetic bubble memory devices incorporating T-bar and chevron permalloy patterns, see A. H. Bobeck, P. I. Bonyhard, and J. E. Geusic, "Magnetic Bubbles—An Emerging New Memory Technology," proceedings of the IEEE Volumne 63, number 8, pages 1176–1195, 1975. Half-disc elements and their use are described in P. I. Bonyhard and J. L. Smith's article, "68k Bit Capacity 16 um-Period Magnetic Bubble Memory Chip Design With 2 um Minimum Features," IEEE Transactions on Magnetics, Volumn MAG-12, Number 6, pages 614–617, 1976.

The cost of bubble memory devices depends on the bit storage density capacity which in turn depends on the bubble diameter size that can be supported and propagated within a device. The nature of the magnetic material and the shape and size of individual permalloy features including the size of the gap spaces between adjacent elements in a permalloy pattern control the size of magnetic bubbles and their movement. Current optical lithographic techniques limit the smallness of these features and gaps to a micrometer or greater. Bubble diameters of approximately two micrometers can be supported and propagated along the patterns of half-disc elements for gap sizes of one micrometer. This is to be compared with three to four micrometer diameter bubbles for T-bar elements with similar one micrometer gaps. Hence, it is desirable to fabricate bubble memory devices using half-disc permalloy elements.

In some magnetic bubble memory devices, bubbles representing information bits travel along elongated oval paths or loops which include one or more major data information loops and a plurality of minor storage loops having a portion of each minor loop nearby a major loop. Bubbles are generated at one end of a major loop and transferred to appropriate minor loops as they pass by the adjacent portions. The bubbles circulate around the minor loop until they are needed, when at the appropriate time, they are transferred into a major loop where they are detected or read. Transfer between loops is accomplished by applying timed electrical current signals to thin strips of conducting material, such as aluminum deposited on the bubble device between the loops. The magnetic field generated by the current flow creates a magnetic potential well along an edge of the conductor. Bubbles to be transferred are trapped within the potential well and moved therealong from one loop to another in response to rotation of an in-plane magnetic field. When a bubble is transferred from a minor loop to a major loop, it is no longer present in the minor loop, and the integrity of the memory is destroyed. To restore the memory, a new bubble can be generated and deposited in a minor loop from which a bubble had been withdrawn. In an improved version when the bubble is transferred from the minor loop to the major loop, it can be replicated so that a bubble remains in the minor loop, and a bubble is supplied to the major loop for detection.

A common method of replication using half-disc elements is described in the Bonyhard and Smith reference at page 615 and 616 and in the Bobeck, Bonyhard and Geusic reference, pages 1180–1182. Briefly, the replication method requires depositing an open electrical conducting loop over a permalloy pattern of half-disc elements which includes a special permalloy disc element. Current is pulsed through the conducting loop when the bubble is stretched on the disc. This cuts the stretched bubble in two with each bubble repelling the other and moving off along different paths defined by the permalloy pattern in response to the in-plane rotating field.

In integrated circuit design, a phenomenon known as electromigration limits the current density which can be applied to thin conducting strips of very small cross section. For example, with conductors made of aluminum, current densities exceeding $10^6$ amps per cm$^2$ have been observed to cause voids in the material which in turn results in conductor breakdown. Yet, it is desirable to keep conductors small since it is desirable to keep integrated circuits small. A conductor 5,000 angstroms thick and two micrometers wide has a cross section of $1 \times 10^{-8}$ cm$^2$. A current flow of 10 milliamps through this conductor to effect transfer of bubbles from one loop to another approaches the electromigration limit of $10^6$ amps per cm$^2$ for aluminum. However, replication requires currents of 100 milliamps or greater. Hence, conductors which are suitable for transfer fuctions may not be suitable for replication without increasing their size significantly. It is therefore desirable to perform the function of replication without use of current flow in separate conductors, i.e. to be able to replicate passively.

The design and operation of a passive magnetic bubble replicator, that is, one not requiring the use of current carrying conductor elements, is described in a paper by P. J. Nelson entitled, "Passive Replicator for Magnetic Bubbles," published in the proceedings of the 1974 M3 Conference, Paper 70-11. The replicator design of Nelson, however, uses a chevron pattern operating with six micron bubbles. This same circuit would not be suitable for operation with one micron bubbles in a half-disc permalloy design.

In addition to avoiding electromigrating effects in small conductors, passive replication will result in reduced power requirements for the device by a factor of a hundred or so.

SUMMARY OF THE INVENTION

A magnetic arrangement for replicating magnetic bubbles in thin planar layers of magnetic material is disclosed which arrangement does not require current carrying conductor elements, but uses instead rotation of an in-plane field in a particular direction with respect to a replicating pattern of permalloy elements. A first group of permalloy elements is disposed on the surface of the magnetic material and defines a first path along which bubbles move in response to a rotating magnetic field, the field rotating in the plane of the material. The first group of elements includes an advance element and a reverse direction element each having first and second end sections and a center section connecting the end sections. The first and second end sections are disposed to be along an imaginary substantially straight first line with the second end section of the advance element adjacent the first end section of the reverse direction element. Also, the center section of both elements lie on a first side of the imaginary first line protruding in a direction away from the first line. The outer edge of the end sections and center section define an element perimeter along which the bubbles move in response to a rotating in-plane field.

A replicating permalloy element similar in shape to that described above is formed and disposed on the magnetic layer to have its first and second end sections lying along a substantially straight replicating line which lies substantially orthogonal to the first line described above. The first end section of the replicating permalloy element is disposed to lie in close proximity to the first line and the first end section of the reverse direction permalloy element described above. The center section of the replicating element lies on a first side of the replicating line protruding away from the replicating line and lying on the same side of the replicating line as the second end section of the reverse direction permalloy element.

Means for providing a magnetic field in the plane of the magnetic layer, rotatable in either a clockwise or counterclockwise direction, moves the bubbles along the path defined by the first group of permalloy elements, specifically along the outer perimeter of the reverse direction and advance permalloy elements. When the bubble reaches the second end section of the advance element, the direction of rotation of the in-plane field is reversed. Continued rotation of the in-plane field in this new direction causes the first end section of the reverse direction element and the replicating permalloy element to have an affinity or attraction for the bubble. Further rotation of the in-plane field causes the bubble to split between the reverse direction element and the replicating element thereby resulting in replication.

In the preferred embodiment, each of the above mentioned permalloy elements is a half-disc element with an arcuate shaped center section connecting the end sections.

This approach for replication can be used in a magnetic arrangement whereby information is stored in closed paths or loops formed by permalloy elements. The information is in the form of the presence or absence of magnetic bubbles at particular positions within the loops at a given time. The bubbles continuously rotate within these closed loops in response to a rotating in-plane field until the information is retrieved or replaced. When depositing (writing) or retrieving (reading) bubbles, it is necessary to transfer bubbles between one or more separate major tracks and the storage or minor loops. One way of reading the bubbles within the minor loops without destroying any information is to replicate bubbles at the region of transfer so that a new bubble enters a major track where it can be read and the old bubble remains in the minor loop.

Applicant's invention provides a magnetic arrangement for passively replicating magnetic bubbles in a layer of magnetic material and for transferring bubbles between first and second tracks of permalloy elements without the need for timed electrical current flow through conductors to effect replication. This eliminates the need for relatively high current density flow through transfer conducting elements and improved reliability for the reasons discussed supra. Applicant discloses using a single linking means arranged between the first and second tracks in a manner described above. Replication takes place when the in-plane magnetic field is rotated in a particular direction with respect to the arrangement of the linking means and the first and second tracks. Transfer between tracks is accomplished by providing a transfer electrical conducting means for transferring bubbles, the transfer taking place in response to timed current signals applied to the transfer electrical conducting means and in response to rotation of the in-plane magnetic field.

In the preferred embodiment, the first and second tracks form a closed minor loop and a major track respectively each comprised of permalloy elements. The linking means is a modified permalloy element with an elongated end section extending away from the first end section. The first end section is disposed adjacent the first end section of a reverse direction element present in the closed minor loop in a manner as described before. The elongated end section is disposed between adjacent end sections of a pair of permalloy elements in the major track. The transfer electrical conducting means extends from a transfer portion of a permalloy element in the major track to a receiving portion of the modified permalloy element near the closed minor loop. The conductor then extends back to an element in the major track. In the preferred embodiment, the conductor is aluminum with a thickness in a direction normal to the plane of the layer of material between 5,000 and 10,000 angstroms and having a width in a direction in the plane of the material of 2–10 micrometers.

When it is desired to transfer a bubble from a major track to a closed minor loop, a timed electrical current signal is applied to the transfer electrical conducting means when a bubble moves onto the perimeter of the transfer portion of a major track element. As the in-plane field continues to rotate, the bubble moves along an edge of the electrical conductor to the receiving portion of the modified element at which time the timed electrical current signal is stopped. Further rotation of the in-plane field will transfer the bubble into the closed minor loop.

When it is desired to transfer a bubble from a closed minor loop to a major track without replication, a timed electrical current signal is applied to the transfer electrical connecting means when the bubble to be transferred has moved on to the first end section of the reverse direction element, and the first end section of the modified element. The timed electrical signal is continued until the bubble moves on to the receiving portion of the modified element in response to the continued rotation of the in-plane field. At this point, the timed electrical signal is stopped and the bubble continues to move along the outer perimeter of the modified element in response to the in-plane rotating field. The bubble will move along the elongated portion and thereby be transferred to the major track.

Other objects, features and advantages of the present invention will become more fully apparent from the following detailed description of the preferred embodiment, the appended claims and the accompanying drawings in which:

DETAILED DESCRIPTION OF THE DRAWINGS

Figure 1:
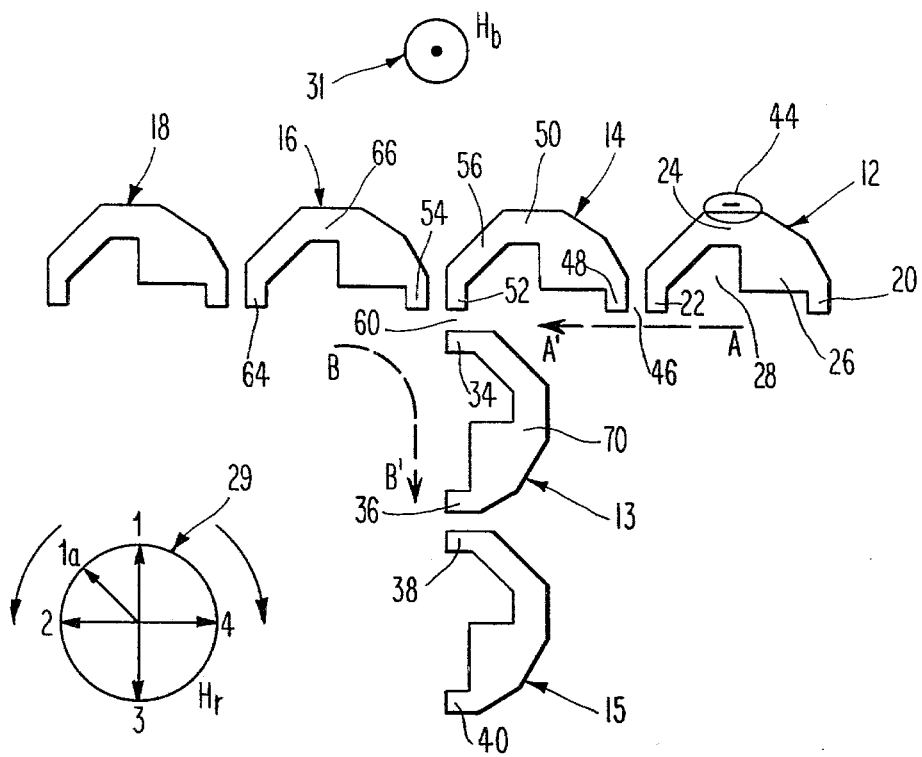
FIG. 1 is a pattern of preferred embodiment permalloy elements for effecting replication of magnetic bubbles in response to rotation of a magnetic field.

Referring now to FIG. 1, a pattern of half-disc permalloy elements designated generally 12, 14, 16, 18, 13 and 15 are shown as they might appear deposited in a magnetic memory device on a thin planar layer of magnetic material. Each half-disc element such as element 12 comprises two end sections 20 and 22 and a center section 24 which connects the two end sections 20 and 22. Asymmetric portion 26 is shown connected to center section 24 and end section 20. Together the sections 20, 22, 24 and 26 partially enclose an open region 28. The outer edges of end sections 20 and 22 along with the substantially arcuate outer edge of center section 24 define or form a convex outer perimeter along which magnetic bubbles formed in the thin planar layer of magnetic material move in response to magnetic forces applied to the magnetic device, and in particular in response to a rotating magnetic field rotating in the plane of the material. It is to be understood that the asymmetric portion 26 could have been shown in a mirror image arrangement and connected to end section 22 and center section 24 instead of end section 20. However, for purposes of description in this application, the asymmetric portion will be shown connected to end section 20.

It is well understood by those skilled in the art that when a thin planar layer of magnetic material, such as a garnet, with suitable characteristics is subjected to a bias field normal to the plane of material such as $H_b$ in FIG. 1, shown pointing in an upward direction perpendicular to the plane of the figure by circle and dot 31, the material becomes magnetized in the same direction as $H_b$ except for separate cylindrical regions of reverse magnetization found in the material. The single wall cylindrical regions usually having circular cross sections are known as magnetic bubbles. The bubbles are free to move within the plane of the material in response to magnetic fields applied thereon.

If the planar material having a pattern of permalloy elements such as that shown in FIG. 1 is subjected to an inplane magnetic field $H_r$ rotatable in a clockwise or counterclockwise direction as depicted by circle 29 in FIG. 1, then the permalloy elements 12 through 18 and 13 and 15 become magnetized according to the orientation of the field $H_r$. Actually, in the preferred embodiment circle 29 represents a means for generating an in-plane rotating magnetic field. In the preferred embodiment the in-plane rotating field generator is comprised of two rectangular cross sectional, air core, electrical coils. One coil is smaller than the other and is nested inside the larger coil so that their air cores are orthogonal to each other. The bubble memory chip is located inside the small coil and a standard lead frame is employed to provide lead wires to the bubble memory chip and the coils. In the preferred embodiment the power source is 100 KHZ at 12 volts but other sources can be used.

If $H_r$ is in the direction of line and arrow 1 in circle 29 of FIG. 1, then elements 12 through 18 will be magnetized with a positive pole located along the center section of each element with negative poles in all end sections of the elements. Meanwhile, end sections 34 and 38 of elements 13 and 15 respectively become positive in polarity while end sections 36 and 40 become negative. As magnetic field $H_r$ rotates in a counterclockwise direction to line and arrow 2 in circle 29, end section 22 of element 12 becomes positive in polarity while end section 20 becomes negative. Elements 14, 16 and 18 become similarly magnetized. For the same position of $H_r$, the end sections of elements 13 and 15 becomes positive in polarity while the center sections become negative. Continued rotation of $H_r$ through positions 3 and 4 will continue to reorient the magnetization of the permalloy elements 12 through 18 and 13 and 15.

The magnetic bubble 44, in FIG. 1, whose magnetization is directed into the plane of the figure opposite to that of $H_b$ will have a negative pole near the planar surface of the magnetic material in which the permalloy elements are deposited. This negative pole will be attracted to the positive pole of a permalloy element. With $H_r$ in position 1, bubble 44 starting at center section 24 of element 12 will move along the convex outer perimeter of element 12 in a direction of dashed line A—A' as $H_r$ rotates in a counterclockwise direction. At field position 2, the bubble 44 will have moved to end section 22 but will not have bridged the gap 46 between elements 12 and 14 since end section 48 has a negative polarity for this field position. At field position number 3, all end sections of elements 12 through 18 become positive in polarity and bubble 44 is attracted to both end sections 22 and 48 of elements 12 and 14 respectively thereby bridging the gap 46. Bubble 44 leaves element 12 and resides solely on the end section 48 at field position 4 and moves to center section 50 of element 14 as $H_r$ completes one full rotation. As the example above illustrates, a bubble will move from a feature such as the center section or end section of a permalloy element to that same feature of an adjacent permalloy element for each full rotation of the field $H_r$.

As $H_r$ continues to rotate in the same direction through positions 2 and 3 to position 4, bubble 44 moves from center section 50 past end section 52 of element 14 onto end section 54 of element 16. If at this time, the direction of rotation of field $H_r$ is reversed, and $H_r$ rotated to position 3 from position 4, bubble 44 will move to the replication region defined by end section 52, end section 34, and gap 60 between them. Continued rotation in the clockwise direction past position 1A in circle 29 will stretch bubble 44 between end section 34 and intermediate portion 56 of element 14 until bubble 44 splits into two bubbles, one located at center section 50 of element 14, and the other located at end section 34 of element 13. Continued rotation of $H_r$ in a clockwise direction will propagate bubble 44 in a direction opposite to the line and arrow A—A' while the newly formed bubble will move along the convex outer edge of element 13 in a direction of line and arrow B—B'.

With the arrangement of FIG. 1, bubbles moving along the primary track formed by the convex outer perimeters of elements 12 through 18 or bubbles moving along the replication track formed by the convex perimeters of elements 15 and 13 in response to counterclockwise rotation of $H_r$ will not replicate at gap 60. It is only when $H_r$ rotates clockwise and bubbles move to gap 60 from left to right that replication will occur. However, replication of bubbles does not depend on clockwise rotation absolutely. It is the relationship of rotation of $H_r$ with respect to the arrangement of replicating element 13 and a nearby element in the primary track which is important for replication. If element 13 were rotated 180° about an axis through its center running from end section 34 to end section 36, and if end section 34 where nearby end section 48 so that gap 60 were formed there, replication would take place for counterclockwise rotation of $H_r$ as bubbles moved from right to left.

In general, replication of bubbles will take place for the following arrangement: an advance permalloy element 16 having a first end section 64 and a second end section 54 with a center section 66 integrally connected therebetween and which is formed and disposed adjacent reversed direction element 14 also having a first end section 52, a second end section 48 and a center section 50 integrally connected therebetween. The first and second end sections 64 and 54 of advance element 16 lie along an imaginary first line which is substantially straight. Reversed direction element 14 is also formed and disposed to have its end sections 52 and 48 lying along the same imaginary straight first line. Center sections 66 and 50 of elements 16 and 14 respectively are formed and disposed to lie on the same side of the imaginary straight first line protruding in a direction away from the first line. The replicating permalloy element 13 also has a first end section 34, a second end section 36, and a center section 70 connected integrally therebetween. The replicating element 70 has its first and second end sections lying along a replicating line, which line is substantially straight and which lies substantially orthogonal to the imaginary first line. The end section 34 of element 70 is located in close proximity to the end section 52 of element 14. Also, the center section 70 of element 13 lies in a direction towards the second end section 48 of element 14. Included in this arrangement is a means for producing an in-plane rotating field which can be rotated in both the clockwise and counterclockwise directions. As the in-plane field is rotated in a first direction, a bubble moves along the convex outer perimeter of reverse direction element 14 advancing past replication region 60 on to the second end section 54 of advance permalloy element 16. At this point the direction of the in-plane field is reversed causing the bubble to reverse its direction and causing the first end section 34 of replication permalloy element 13 to have an affinity for the bubble. Further rotation in this reversed direction causes the bubble to split between the first end section 52 of the reverse direction permalloy element 14 and the first end section 34 of the replication element 13 thereby resulting in replication.

In the preferred embodiment of applicant's invention, the advance permalloy element, the reverse direction permalloy element, and the replicating permalloy element are half-disc permalloy elements. The center sections of the half-disc elements are substantially arcuate in shape. However, any element having a pair of end sections lying along a substantially straight line and having a center section which is connected integrally therebetween and which protrudes to one side of the line connecting the end sections will work in applicant's invention. Such an alternate element is a well-known chevron element.

Figure 2:
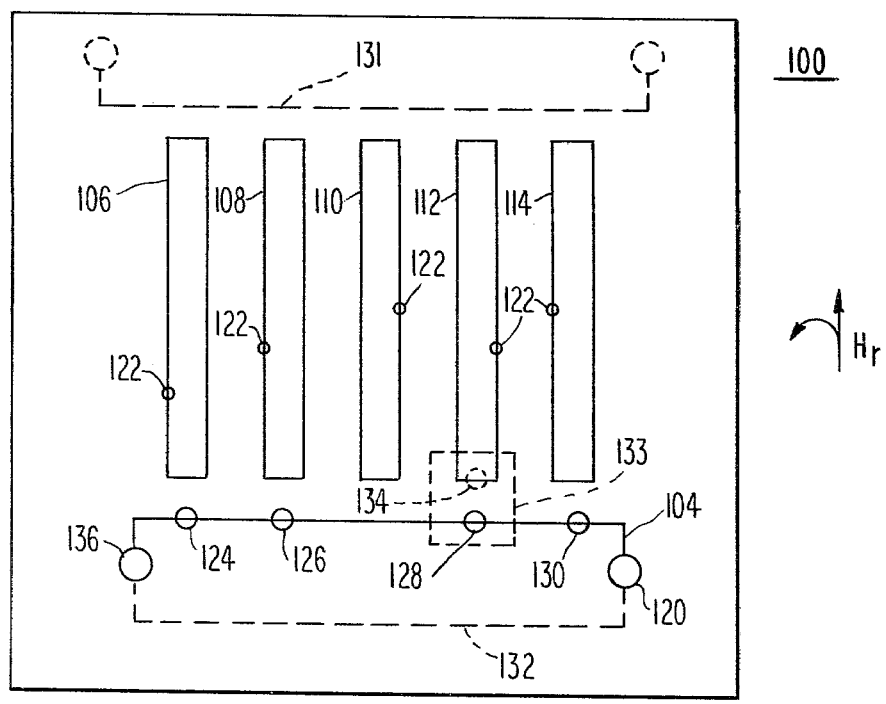
FIG. 2 is a preferred embodiment schematic of a magnetic bubble memory device showing a major track and plurality of closed minor loops.

FIG. 2 is a schematic of a bubble memory device designated generally 100. The rectangular area 102 represents the thin planar layer of magnetic material such as garnet equipped with a major track 104 and minor loops 106 through 114 comprised of permalloy elements such as half-disc elements. Bubbles are generated at a generator represented by circle 120 and enter the major track at this point. In response to rotating in-plane magnetic field, $H_r$, rotating counterclockwise in the example of FIG. 2, the bubbles move along the major track 104 in a right to left direction past the nearby end portions of minor loops 106 through 114. As a newly formed bubble moves along side the minor loop in which it is to be stored, it is transferred into that loop where it will circulate continuously in a clockwise sense. Note the bubbles 122 in the minor loops.

When information within the minor loops are to be read or retrieved, the bubbles are transferred back into the major track 104 from the end portions of the minor loops 106 through 114. The device 100 is equipped with five minor loops as shown in FIG. 2, representing a five bit word. Of course, many more minor loops could be added as desired. When a word is required from the minor loops, a transfer is initiated and the bubbles present in the end portions of loops 106-114 are transferred together into major track 104 such as as the bubbles 124, 126, 128 and 130 in FIG. 2, representing the word 11011. The 0 in the third position occurs since no bubble was present in the end portion of the third loop 110 when transfer was initiated. It is also possible that the bubble memory device could be equipped with more than one major track. For example, in FIG. 2, the dotted major track 131 is shown at the opposite ends of minor loops 106 through 114 from major track 104. Also, major track 104 could be formed as a closed major loop by adding dotted section 132.

The dotted box 133 encloses the transfer region between minor loop 112 and major loop 104. The position of bubble 128 in minor loop 112 prior to transfer is indicated by the dotted circle 134 in the end portion of minor loop 112.

Once the bubbles are transferred into the major track, they move in a right to left direction in major track 104 in response to the rotating in-plane field. As the bubbles 124 through 130 reach the opposite end of 104 from generator 120, they are detected and read by a detector circuit represented by the circle 136. Various generator circuits and detector circuits are disclosed in the references cited herein.

It is desirable to be able to replicate the bubbles in the minor loops at the time of transfer so that the information contained there can be read nondestructively. One way to do this is to replicate bubbles at the time of transfer leaving a bubble behind in the minor loop. In the past, this has been done by using special permalloy linking elements and electrical conducting strips to perform the functions of transferring and replication. However, as described previously, replication requires relatively large current density flow through the deposited conductors making them subject to eventual failure because of the previously described electromigration phenomenon.

Applicant has discovered a means for replicating and transferring bubbles between first and second tracks of permalloy elements in bubble memory devices which includes a single linking element means for replicating magnetic bubbles contained in a first track without the need for electrical current flow in deposited conductors. Instead, replication is accomplished by using the rotating magnetic field and permalloy element arrangements described above.

In order to provide transfer of bubbles from a first track to a second track without replication or to provide transfer from a second track to a first track, a transfer electrical conducting means is required. Timed current signals are applied to the conductor during selected orientations of the in-plane field. The current density required to effect transfer are considerably smaller than that required for replication.

Figure 3:
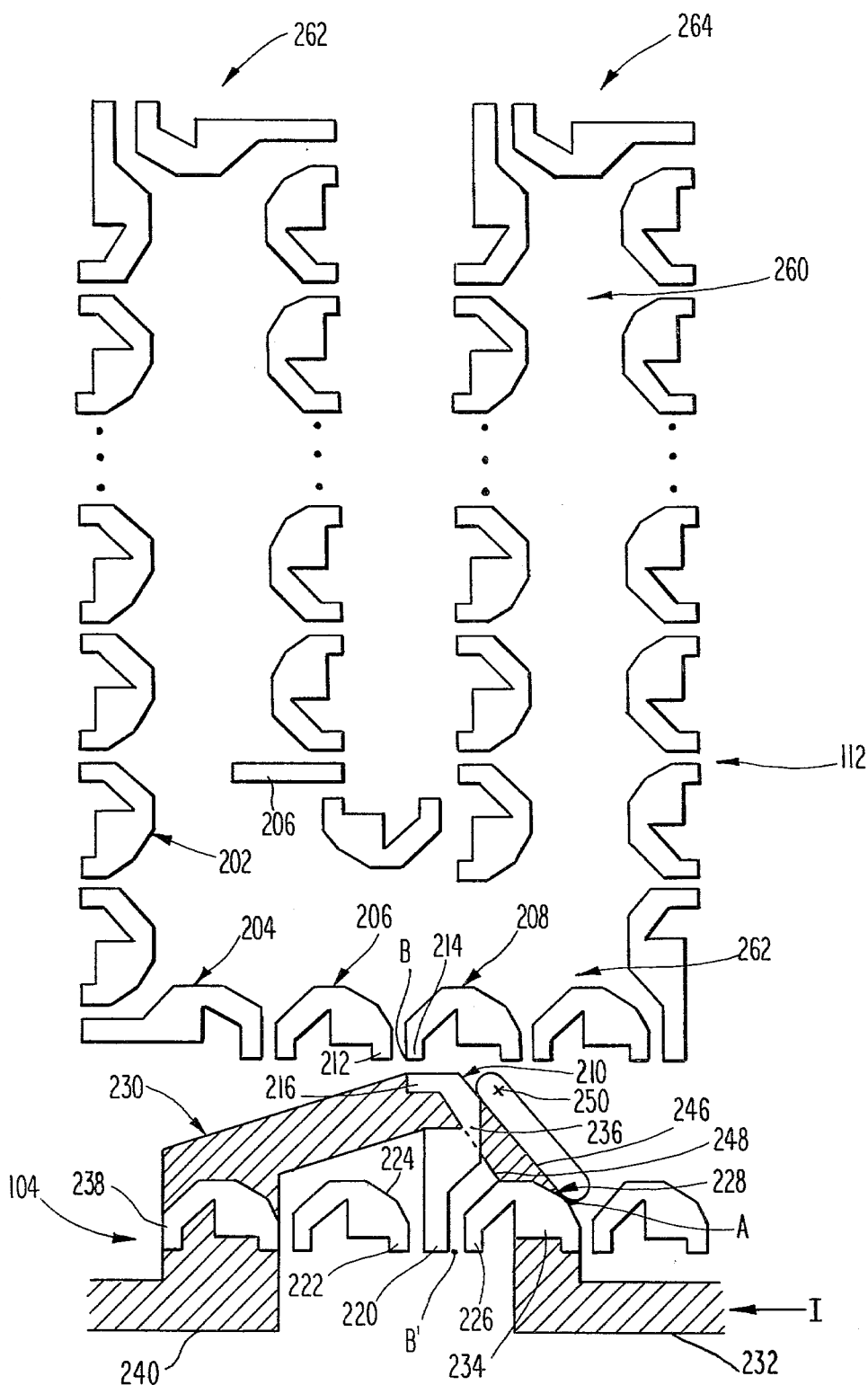
FIG. 3 is a preferred embodiment pattern of permalloy elements forming one of the minor loops of FIG. 2 and a portion of the major track, and showing the replication and transfer arrangement of applicant's invention.

FIG. 3 shows a minor loop such as minor loop 112 formed mainly from a pattern of half-disc elements such as element 202 and modified half-disc elements such as element 204. In the preferred embodiment of applicant's invention, the closed loop 112 is U-shaped enclosing an interior region designated generally 260. The U-shaped loop is comprised of loop base portion designated generally 262 and leg portion designated generally 264 and 266. Loop base portion 262 joins leg portions 264 and 266 to define loop interior region 260. The base portion 262 is shown nearby a portion of major track 104 also comprised of half-disc elements. A modified element designated generally 210 is disposed between the loop base portion 262 and the half-disc elements of major track 104. Bubbles travel along the convex outer perimeter of the half-disc and modified half-disc elements in response to an in-plane magnetic field in a manner as described previously. The loop 112, shown in FIG. 3, is unusual in that the arcuate center portions of the elements protrude in a direction into the interior region 260 of the closed loop instead of outward which is normally the case when fabricating closed loops from half-disc elements in bubble memories. It is believed that this arrangement facilitates passive replication as taught by applicant's invention since it provides for a pair of adjacent normal half-disc elements such as 206 and 208 in FIG. 3. However, a more normally shaped oval or quasi-rectangular minor loop employing half-disc elements with the arcuate center portions still protruding to the interior region could be employed in applicant's invention. For example, the first end portion of element 206 could be elongated to act as element 204 and the center section of the U could be unfolded to form the oval or quasi-rectangular loop.

Element designated generally 206 in an advance permalloy element similar to element 16 in FIG. 1 while element designated generally 208 is a reverse direction element similar to element 14 in FIG. 1. Modified element designated generally 210 is similar to replicating permalloy element 13 of FIG. 1, and together with element 206 and 208 provide a means for replicating a bubble located at the second end section 212 of element 206 as a rotating in-plane field moves the bubble onto second end section 214 of element 208 and first end section 216 of element 210. Further rotation of $H_r$ in a clockwise direction will split the bubble forming two bubbles, one traveling within minor loop 112, a new bubble traveling along the convex outer perimeter of modified element 210.

The modified element 210 has an elongated end section 220 which extends away from the first end section 216. Element 210 is a linking means between minor loop 112 and major track 104. The first end section 216 is nearby to first end section 214 of element 208 while the elongated end section 220 is located between the second end section 222 of element 224 and the first end section 226 of element 228. The replicated bubble moving along the convex outer perimeter of element 210 in response to a clockwise rotation of the in-plane field $H_r$ will travel along the edge of elongated end section 220 where it will be attracted to end sections 222 and 226 as well. Then the rotation of the field is reversed again in a counterclockwise sense, and the bubble will propagate a way from right to left in track 104 to the detector circuit 136 of FIG. 2. Hence, when it is desired to nondestructibly read bubbles rotating counterclockwise within the minor loops, the counterclockwise rotation of $H_r$ is reversed when the bubble reaches end section 212. With further clockwise rotation replication occurs, and the new bubble moves to end section 222, 220, and 226 at which time the field $H_r$ is reversed again to the counterclockwise direction when the replicated bubble moves away.

It will be appreciated that the description of counterclockwise and clockwise rotations of $H_r$ and the characterization of movement of the bubbles from right to left or left to right, are dependent upon the configuration shown in FIG. 3. Opposite sense directions of the magnetic field and movements of the bubble as described above, can be utilized by a rearrangement of the linking means element 210 with respect to the half-disc elements in the end portion of minor loop 112 in a manner described supra.

A transfer electrical conducting means for transferring bubbles between first and second tracks in response to timed current signals and rotation of an in-plane field is shown as a strip of metallic conductor designated generally 230 deposited on the surface of the magnetic layer. The strip extends along the surface of the magnetic layer from a first lead portion 232 of the strip under a transfer portion 234 of a first half-disc element 228 of major track 104. From there the strip extends to a receiving portion 236 of modified linking element 210 where it passes under this portion of the modified linking element and then returns to an element in the major track such as half-disc element 238 where it passes under element 238 and then away from the minor loop 112-major track 104 transfer-replication region with second lead portion 240. The electrical conducting strip 230 lies interlinkably between the surface of the magnetic layer and: (1) a transfer portion 234 of the first half-disc element 228 of major track 104; (2) the receiving portion 236 of modified linking element 210; and (3) a second half-disc element in major track 104 such as element 238.

When a timed electrical current signal, such as current I, is applied to the conducting strip 230, a magnetic field is set up around the conductor. For the direction of I shown in FIG. 3, using the right-hand rule of physics, the magnetic field due to current flow I, will oppose the bias field $H_b$ along edge 246 of the conducting strip 230 while reinforcing the bias field $H_b$ along edge 248. This creates a magnetic potential "well" along edge 246. A bubble located in the vicinity of the transfer portion 284 on the convex outer perimeter of element 228 when current I is pulsed through conductor 230 will be attracted into the potential well along edge 246 between elements 228 and 210. (See bubble 250 in FIG. 3.) The bubble will not migrate to edge 248 since there is a potential barrier there due to the heightened field value of $H_b$.

As an example of transfer operation, consider the followwing: when a magnetic bubble has moved to location A in FIG. 3 on the perimeter of transfer portion 234, a timed electrical current signal is applied to the transfer electrical conductor 230. The in-plane field is rotating counterclockwise and is oriented approximately midway between locations 4 and 1 in circle 29 of FIG. 1. At this time, the bubble will stretch along the potential "well" created along edge 246 of the conductor to the perimeter of the receiving portion 236 of element 210 since the bubble is attracted to the positive poles of both the transfer region of element 228 and the receiving portion of element 210. The timed electrical signal is continued for an approximate 90° counterclockwise rotation of $H_r$ to a in-plane field position between positions 1 and 2 of circle 29. During this time, the bubble is pulled from element 228 to element 210 along edge 246. The counterclockwise rotation continues with the current stopped, and bubble 250 returns to a normal bubble approximating a circular cross section located at B in minor track 112 with $H_r$ at position 3. Further rotation of $H_r$ will move the bubble along within minor track 112.

It is also necessary to be able to empty a space in the minor loop so that new data can be added when desired. It is possible to do this with the same current loop 230. With the old data bubble at location B on edge sections 212 and 214, a current I is applied in the direction shown in FIG. 3 to the transfer electrical conductor 230. This current I is held for 90° while the in-plane rotating field is rotated in a clockwise direction from position number 2 to position number 1 in circle 29 of FIG. 1. Normally, a bubble would replicate during this process, but since a current is flowing through the conductor 230, a magnetic potential "well" is created in the material along the edge 246 including a portion of the convex outer perimeter of element 210 down to end section 216. The bubble located at B when the field was in position number 2 is now trapped in the "well" during the 90° rotation of the magnetic field from position number 2 to position number 1. This prevents replication and begins to move the bubble along the convex outer perimeter of linking element 210. At position number 1 of the in-plane field, the current is stopped and the field continues in a clockwise direction and bubble moves along the convex outer perimeter of linking element 210 including the elongated section 220. When the bubble reaches B' at the end of end section 220 with the field value in position number 3, it will be attracted to end sections 222 and 226 as well. Here the field is reversed in direction and the bubble will propagate along the convex outer perimeters of the half-disc elements in major track 104 toward the detect and annihilation end.

The transfer electrical conductor 230 in the preferred embodiment is made out of aluminum and has a thickness in a direction normal to the plane of the material of between 5,000 and 10,000 angstroms. The width of the conductor along its length between the transfer portion of element 228 and the received portion of element 210 varies between 5 micrometers and 10 micrometers. However, it may be desirable to limit the thickness of the conductor to less than 5,000 angstroms and to limit the width of the conductor in the plane of the material in the region between the transfer portion and receiving portion of the permalloy elements to less than 2 micrometers. It may also be desirable to add a percentage of copper to the aluminum to increase the conductivity and mitigate the electromigration effects. For example, a conductor which consists of four percent copper with the remainder being fabricated from aluminum may be used with applicant's invention. Various other conducting materials such as silver or gold may also be substituted.

While the present invention has been disclosed in connection with the preferred embodiment thereof, it should be understood that there may be other embodiments which fall within the spirit and scope of the invention as defined by the following claims.

What is claimed is:

1. Bubble memory arrangement of the type wherein magnetic bubbles within a planar layer of material are moved in response to magnetic forces thereon, including an in-plane rotating magnetic field, said bubbles being moved along paths defined by a pattern of permalloy elements, said permalloy elements including an advance permalloy element and a reverse direction permalloy element both disposed in a first path and a replication permalloy element connecting said first path to another path, said bubble memory arrangement comprising:

a. said advance permalloy element being formed to have first and second end sections and a center section integrally connected therebetween, said advanced permalloy element formed and disposed to have its first and second end sections lying along a first line which line is substantially straight and with said center section lying on a first side of said first line;

b. said reverse direction permalloy element being formed to have first and second end sections and a center section integrally connected therebetween, said reverse direction permalloy element formed and disposed to have its first and second end sections lying along said first line and having its center section lying on said first side with respect to said first line and further disposed so that said first end section of said reverse direction permalloy element lies in close proximity to said second section of said advanced permalloy element;

c. said replicating permalloy element being formed to have first and second end sections and a center section connected integrally therebetween, said replicating permalloy element formed and disposed to have its first and second end sections lying along a replicating line which line is substantially straight and which lies substantially orthogonal to said first line and further formed and disposed so that its first end section lies in close proximity to said first line and to said first end section of said reverse direction permalloy element, and so that its center section lies on a first side of said replicating line in a direction towards said second end section of said reverse direction permalloy element; and d means for producing an in-plane rotating field whose direction can be reversed when a bubble reaches said second end section of said advanced permalloy element from said reverse direction permalloy element to cause said bubble to reverse its direction and to cause said replication permalloy element to have an affinity for said bubble, and whose further rotation in said reverse direction causes said last mentioned bubble to split between said first end sections of said reverse direction permalloy element and said replication element thereby effecting a replication.

2. The invention of claim 1 wherein said center sections respectively of said advanced permalloy element, said reverse permalloy element, and said replicating permalloy element have a substantially arcuate shape.

3. A bubble memory arrangement of the type wherein magnetic bubbles within a planar layer of material are moved in response to magnetic forces thereon, including an in-plane rotating magnetic field, said arrangement comprising:

(a) first and second tracks comprising half disk permalloy elements, said first track comprising advance and reverse elements, each formed to have first and second end sections and a center section integrally connected therebetween, said first and second end sections lying along a first line which line is substantially straight and with said center sections lying on a first side of said first line, said first end section of said reverse element lying in close proximity to said second end section of said advance element;

(b) a modified half-disk element arranged between said first and second tracks for replicating bubbles located in said first track in response to rotation of said in-plane magnetic field, said rotation being in a predetermined direction with respect to said arrangement of said modified element between said first and second tracks, said modified half-disk element being formed to have a first end section and an elongated end section and a center section connected integrally therebetween, said modified half-disk element disposed to have its first and elongated end sections lying along a replicating line which line is substantially straight and which lies substantially orthogonal to said first line and further formed and disposed so that its first end section lies in close proximity to said first line and to said first end section of said reverse direction element, and so that its center section lies on a first side of said replicated line in a direction toward said second end section of said reverse direction permalloy element; and (c) transfer electrical conductor means for transferring bubbles from said first and second tracks to said modified element in response to said timed current signals to said conducting means and rotation of said in-plane field, said transfer electrical conductor means being formed and disposed to lie interlinkably between said layer of material and a portion of said second track to a portion of said modified half-disk element.

4. The invention of claim 3 wherein said first track is a closed minor loop and said minor loop is U-shaped including a pair of leg portions, each partially enclosing an interior region, and a base portion joining said leg portions and completing the enclosure of said interior region.

5. The invention of claim 4 wherein all of said half-disc elements of said U-shaped loop are disposed with said center sections protruding into said interior region.

6. The invention of claim 3 wherein said second track is a major track and includes first and second half-disk permalloy elements with said elongated end section of said modified element being disposed therebetween and wherein each of said half disk elements has a transfer portion and a return portion and wherein said modified element has a receiving portion.

7. The invention of claim 6 wherein said transfer electrical conducting means is formed and disposed to lie interlinkably between said layer of magnetic material and said transfer portion of said first half-disc permalloy elements in said major track to said receiving portion of said modified element and then back to said return portion of said second half-disk permalloy element in said major track.

8. The invention of claim 7 wherein said transfer electrical conductor means has a thickness, in a direction normal to the plane of said layer of magnetic material between 5000 and 10,000 angstroms, and said transfer electrical conductor means has a width, along the planar surface of said layer of magnetic material between said transfer portion and said receiving portion, of between five micrometers and ten micrometers.

9. The invention of claim 7 wherein said transfer electrical conductor means has a thickness in a direction normal to the plane of said layer of magnetic material, which is less than 5000 angstroms, and said transfer electrical conductor means has a width in the plane of the layer between said transfer portion and said receiving portion which is less than two micrometers.

10. The invention of claim 7 wherein said first track is a closed minor loop and a timed electrical current signal applied to said transfer electrical conducting means is initialized when a bubble to be transferred from said major track to said closed minor loop has moved onto the perimeter of said transfer portion of said major track half disk element in response to rotation of said in-plane field, said timed electrical current signal continuing until said bubble moves along an edge of said signal electrical conducting means to the perimeter of said receiving portion of said modified element in response to continued rotation of said in-plane field at which time said timed electrical signal is stopped and said bubble is transferred to said closed minor loop upon further rotation of said in-plane field.

11. The invention of claim 10 wherein said in-plane field rotates approximately 90 degrees during the duration of said timed electrical signal.

12. The invention of claim 7 wherein said first track is a closed minor loop and a timed electrical current signal applied to said transfer electrical conducting means is initialized when a bubble to be transferred from said closed minor loop to said major track has moved onto said first end section of said reverse direction element and said remaining end section of said modified element in response to rotation of said in-plane field, said timed electrical current signal continuing until said bubble moves onto said perimeter of said receiving portion of said modified element in response to continued rotation of said in-plane field at which time said timed electrical signal is stopped and said bubble continues to move along said convex outer perimeter of said modified element to said elongated end section of said modified element disposed between end sections of said pair of half disk elements in said major track in response to continued rotation of said in-plane field.

13. The invention of claim 12 wherein said in-plane field rotates approximately 90 degrees during the duration of said timed electrical signal.

* * * * *